United States Patent
Lin et al.

(10) Patent No.: US 7,678,248 B2
(45) Date of Patent: Mar. 16, 2010

(54) CIRCULATED COOLED TARGET

(75) Inventors: Wuu-Jyh Lin, Taoyuan County (TW);
Mao-Hsung Chang, Hsinchu County (TW); Ping-Yen Huang, Miaoli County (TW); Jenn-Tzong Chen, Taipei (TW); Ting-Shien Duh, Taoyuan County (TW); Dow-Che Chen, Taoyuan County (TW); Kuo-Yuan Chu, Taoyuan County (TW)

(73) Assignee: Atomic Energy Council, Taoyuan (TW)

( * ) Notice: Subject to any disclaimer, the term of this patent is extended or adjusted under 35 U.S.C. 154(b) by 811 days.

(21) Appl. No.: 11/500,936

(22) Filed: Aug. 9, 2006

(65) Prior Publication Data

US 2008/0041719 A1   Feb. 21, 2008

(51) Int. Cl.
*C23C 14/00* (2006.01)
(52) U.S. Cl. .................................. 204/298.09
(58) Field of Classification Search ............ 204/298.09; 378/130, 141, 199
See application file for complete search history.

(56) References Cited

U.S. PATENT DOCUMENTS 4,434,042 A * 2/1984 Keith ..................... 204/298.09
5,482,611 A * 1/1996 Helmer et al. ......... 204/298.17

FOREIGN PATENT DOCUMENTS

EP       1077357 A1 * 2/2001
JP    2004037379 A  * 2/2004

OTHER PUBLICATIONS

Impurities in the [180]Water Target and their Effect on the Yield of an Aromatic Displacement Reaction with {18F}Flouride, Schlyer, David J. et al, Appl. Radiat. Isot. vol. 44, No. 12, pp. 1459-1465, 1993.*

* cited by examiner

*Primary Examiner*—Nam X Nguyen
*Assistant Examiner*—John Brayton
(74) *Attorney, Agent, or Firm*—Jackson IPG PLLC

(57) ABSTRACT

A liquid and a gas is constantly filled into a target chamber of a target. Then the liquid and the gas flow around the chamber and are flown out. By doing so, the target is effectively cooled down.

4 Claims, 5 Drawing Sheets

CIRCULATED COOLED TARGET

FIELD OF THE INVENTION

The present invention relates to cooling a target; more particularly, relates to cooling down a target chamber effectively.

DESCRIPTION OF THE RELATED ART

A prior art is proclaimed in Taiwan, called "The equipment and method for the production of semi-conductor device sputtering." The sputtering equipment of the prior art comprises a machine room for sputtering a wafer; a target pole departed from the wafer above the machine room; a backplate having the target pole below and having a cooling gas tubing within, the cooling gas tubing having a cooling gas for cooling the target pole by recycling; and a cooling gas supplier providing and recycling the cooling gas to and in the cooling gas tubing.

The sputtering equipment has a sputtering method comprising the following steps:

a) A water is loaded on a crystal housing in the machine room.

b) By applying 15 kW (kilo watt) to 45 kW of a high frequency power to the target pole, a reaction gas is supplied to the sputtering equipment at a rate of 3 standard cubic centimeters per minute (SCCM) to 10 SCCM to maintain an inner pressure of the sputtering equipment at 0.1 milliTorr (mTorr) to 1 mTorr to sputter and deposit a target material on the wafer.

Thus, a sputtering method for ladder coating under a certain speed is obtained.

Although the above prior art obtains a sputtering method for ladder coating under a certain speed, the cooling gas tubing does not have a cooling effect good enough to sustain a high temperature produced on irradiating a proton beam on the target material. Hence, the prior art does not fulfill users' requests on actual use.

SUMMARY OF THE INVENTION

The main purpose of the present invention is to fill in a required liquid and a required gas from a liquid inlet and a gas inlet of a first target chamber for circulating a concave part of a carrier element and outputting from an outlet of a second target chamber to cool down a cooling target effectively.

To achieve the above purpose, the present invention is a circulated coo led target, comprising a first target chamber having a hole part at center, the hole part having a first foil layer and a second foil layer, the first foil layer being encircled with a flow channel, the flow channel being connected with a liquid inlet and a gas inlet; a second target chamber being deposed on a surface of the first target chamber, the second target chamber having a communicating chamber having a rim being set with a concave, the second target chamber having an outlet connecting to the communicating chamber on the outside surface of the second target chamber; and a carrier element being deposed in the communicating chamber, the carrier element having a store part at an end, the carrier element having a concave part encircling the carrier element, the concave part having a gap. Accordingly, a novel circulated coo led target is obtained.

BRIEF DESCRIPTIONS OF THE DRAWINGS

The present invention will be better understood from the following detailed description of the preferred embodiment according to the present invention, taken in con junction with the accompanying drawings, in which FIG. 1 is the perspective view showing the preferred embodiment of the present invention;

DESCRIPTION OF THE PREFERRED EMBODIMENT

The following description of the preferred embodiment is provided to understand the features and the structures of the present invention.

Figure 1:
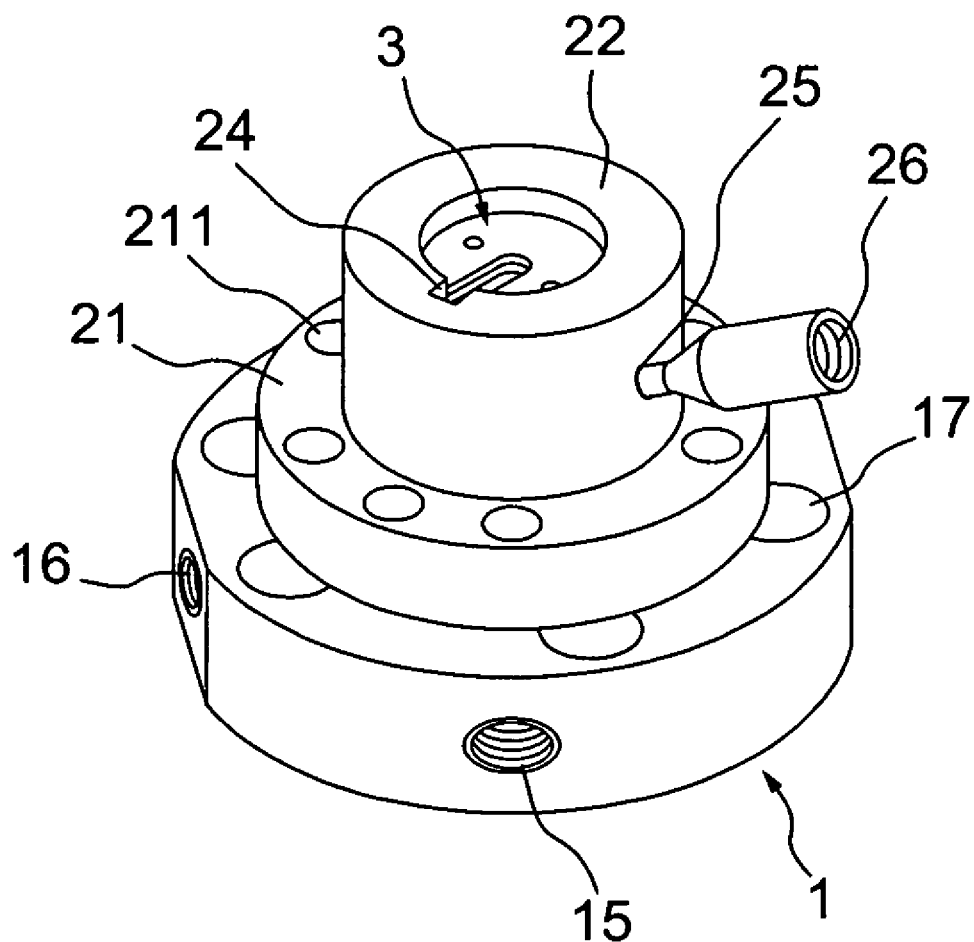
Figure 2:
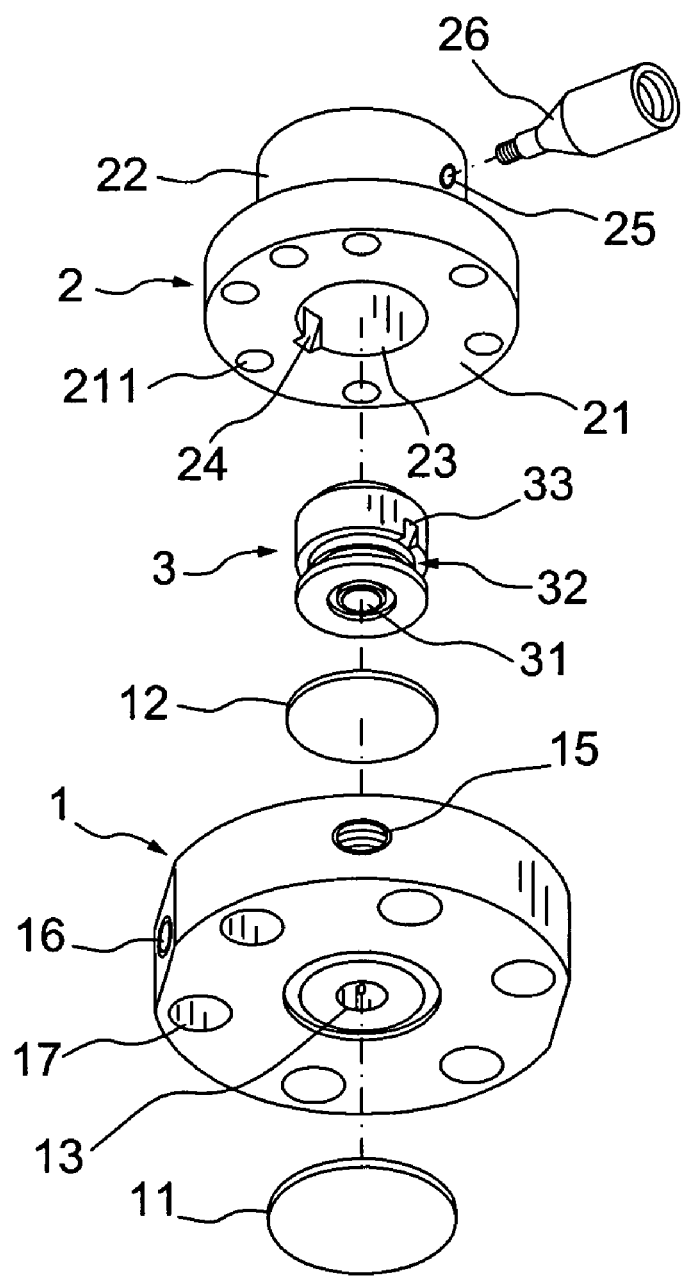
FIG. 2 is the first explosive view of the preferred embodiment.
Figure 3:
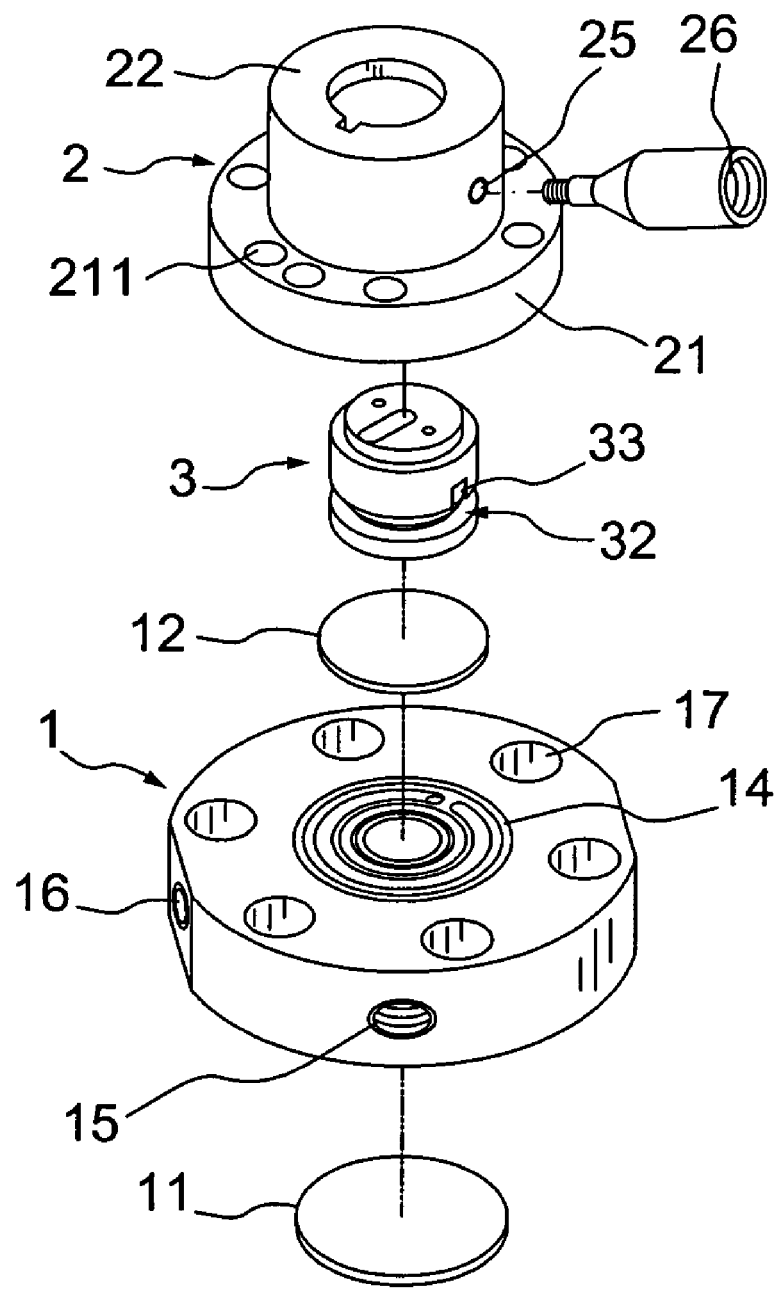
FIG. 3 is the second explosive view.

Please refer to FIG. 1, FIG. 2 and FIG. 3, which are a perspective view, a first explosive view and a second explosive view showing a preferred embodiment of the present invention. As shown in the figures, the present invention is a circulated cooled target, comprising a first target chamber 1, a second target chamber 2 and a carrier element 3, where a required cooling gas and a required cooling liquid are filled into the first target chamber 1 and is flown out from the second target chamber 2 after circulating the carrier element 3 to cool down the target.

The first target chamber 1 has a hole part 13 at center and the hole part 13 has a first foil layer 11 and a second foil layer 12 at two opposite ends; has a flow channel 14 on a surface of the first target chamber 1 encircling the hole part 13; has a liquid inlet 15 and a gas inlet 16 on outside surface of the first target chamber 1 to connect to the flow channel 14; and has a plurality of first fixing holes 17.

The second target chamber 2 comprises a disc lump 21; and an extension part 22 on a side surface of the disc lump 21. The disc lump 21 is deposed on a surface of the first target chamber 1 which surface has the flow channel 14. The disc lump 21 has a plurality of second fixing holes 211 corresponding to the first fixing holes 17 of the first target chamber 1 to be locked by a plurality of fixing members (not shown in the figures) through the first and the second fixing holes 17, 211. The second target chamber 2 has a communicating chamber 23 at center penetrating through the disc lump 21 and the extension part 22. The communicating chamber 23 has a concave 24 deposed on the disc lump 21 at a proper position of a rim of the communicating chamber 23. The second target chamber 2 has an outlet 25 on an outside surface of the extension part 22 and the outlet 25 connects to the communicating chamber 23. And the outlet 25 is connected with a tubing 26.

The carrier element 3 is located in the communicating chamber 23; and has a store part 31 on an end surface and a concave part 32 which encircles the carrier element 3. And the concave part 32 has a gap 33 at a proper position of a side of the concave part 32. Thus, a novel circulated cooled target is obtained.

Figure 4:
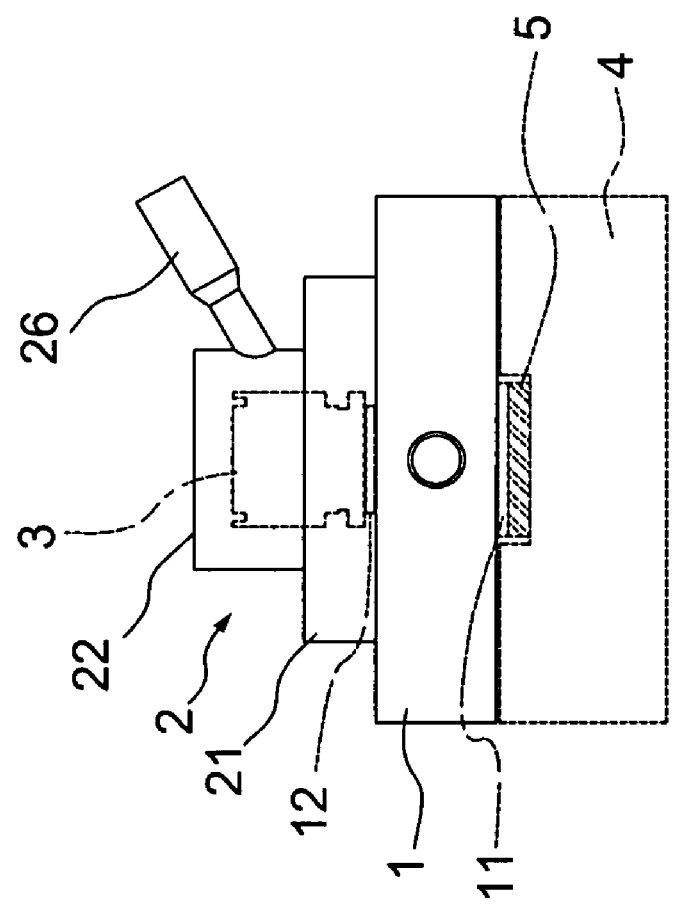
FIG. 4 is the side view showing the state of use.
Figure 5:
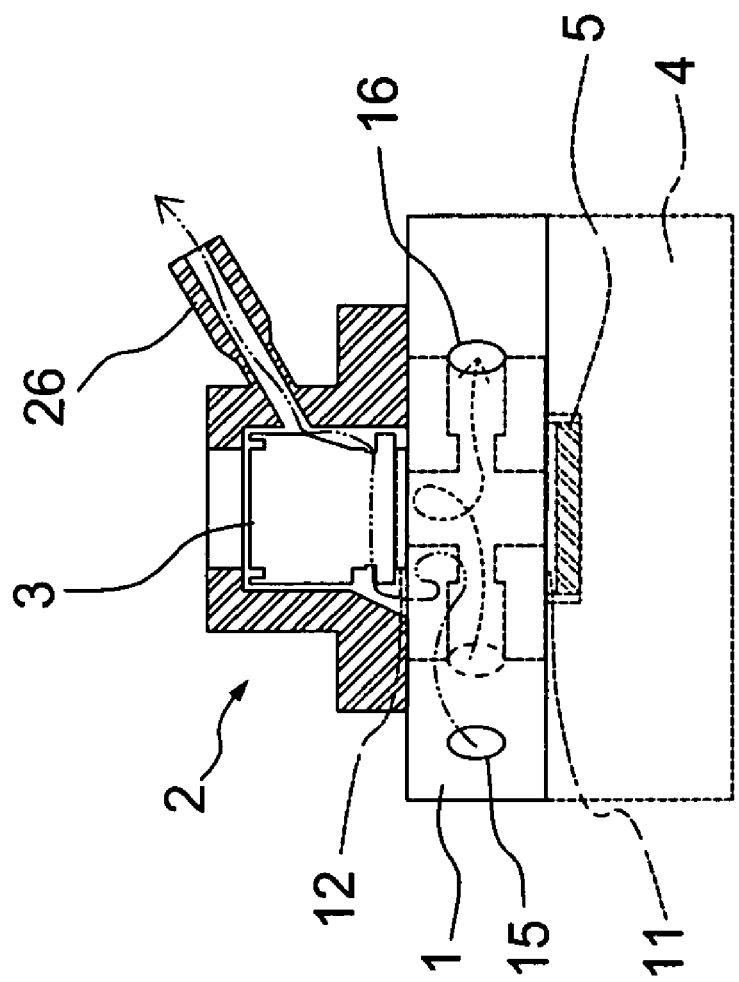
FIG. 5 is the sectional view showing the state of use.

Please refer to FIG. 4 and FIG. 5, which are a side view and a sectional view showing a state of use. As shown in the figures, when using the present invention, a vacuum chamber 4 is connected to a first target chamber 1; a target material 5 is then put on a store part 31 of a carrier element 3 to be irradiated with a proton beam from a side of the first target chamber 1; and water and helium gas is filled in from a liquid inlet 15 and a gas inlet of the first target chamber 1 respectively. A first foil layer 11 is used to make the first target chamber 1 airtight, and a second foil layer is used to prevent liquid isotope from leaking when processing a reaction of the target material 5. As the water and the helium gas are filled in from the liquid inlet 15 and the gas inlet 16, the water and the helium gas are flown to a concave part 32 of the carrier element 3; then the water and the helium gas circulate the concave part 32 and is flown out from an outlet 25 of a second target chamber 2 to be guided to a required place by a tubing 26. By doing so, the carrier element 3 is effectively cooled down by the circulating of the water and the helium gas.

To sum up, the present invention is a circulated cooled target, where a required cooling water and a required cooling gas is filled into a first target chamber from a liquid inlet and a gas inlet to cool down the target by circulating a carrier element coordinated with a concave part and then being flown out from an outlet of a second target chamber.

The preferred embodiment herein disclosed is not intended to unnecessarily limit the scope of the invention. Therefore, simple modifications or variations belonging to the equivalent of the scope of the claims and the instructions disclosed herein for a patent are all with in the scope of the present invention.

What is claimed is:

1. A circulated cooled sputtering target, comprising:

a first target chamber, said first target chamber having a hole part at center of said first target chamber, said hole part having a first foil layer at an end of said hole part and a second foil layer at the opposite end of said hole part, said first target chamber having a flow channel encircling said hole part at a rim of said hole part on a surface of said first target chamber, said first target chamber having a liquid inlet and a gas inlet on an outside surface of said first target chamber, said liquid inlet and said gas inlet both connecting to said flow channel;

a second target chamber, said second target chamber deposing on a surface of said first target chamber which surface has said flow channel, said second target chamber having a communicating chamber at center of said second target chamber, said communicating chamber having a notch in a rim of said communicating chamber, said notch extending from said rim into said communicating chamber, said second target chamber having an outlet on an outside surface of said second target chamber, said outlet connecting to said communicating chamber;

a carrier element, said carrier element being located in said communicating chamber, said carrier element having a store part at an end surface of said carrier element, said carrier element having an indented ring encircling said carrier element, said indented ring having a gap at a position at a side of said indented and a sputtering target located on said first foil layer.

2. The target according to claim 1, wherein said first target chamber and said second target chamber have a plurality of first fixing holes and a plurality of second fixing holes, respectively, to be locked by a plurality of fixing members; and wherein said first fixing holes of said first target chamber and said second fixing holes of said second target chamber are corresponding to each other separately.

3. The target according to claim 1, wherein said second target chamber comprises a disc lump and an extension part and said extension part is deposed on a side surface of said disc lump; wherein said communicating chamber is penetrated through said disc lump and said extension part;

wherein said notch is deposed on said disc lump; and wherein said outlet is deposed on an outside surface of said extension part.

4. The target according to claim 1, wherein said outlet of said second target chamber is connected with a tubing.

* * * * *